United States Patent [19]

Williams

[11] 4,270,090
[45] May 26, 1981

[54] D.C. ELECTROSTATIC VOLTAGE FOLLOWER HAVING ION-COUPLED PROBE

[76] Inventor: Bruce T. Williams, 86 Park Lane Cir., Lockport, N.Y. 14094

[21] Appl. No.: 899,390

[22] Filed: Apr. 24, 1978

[51] Int. Cl.³ .................. G01R 5/28; G01R 29/12
[52] U.S. Cl. ............................. 324/457; 324/72; 324/123 C
[58] Field of Search .............. 324/32, 72, 109, 123 C, 324/457, 469; 250/384

[56] References Cited

U.S. PATENT DOCUMENTS

| | | | |
|---|---|---|---|
| 2,927,269 | 3/1960 | Ecker et al. | 324/72 |
| 3,384,747 | 5/1968 | Able | 324/32 |
| 3,449,668 | 6/1969 | Blackwell et al. | 324/72 |
| 3,611,127 | 10/1971 | Vosteen | 324/72 |
| 3,729,675 | 4/1973 | Vosteen | 324/72 |
| 3,846,700 | 11/1974 | Sasaki et al. | 324/72 |
| 3,970,920 | 7/1976 | Braun | 324/32 |

FOREIGN PATENT DOCUMENTS 569981  11/1975  Switzerland ............... 324/72

OTHER PUBLICATIONS

Brewer, A.; An Electrometer Valve Voltmeter of Wide Range, Jour. of Scie. Inst., vol. 30, Mar. 1953; pp. 91-92.
Costa et al.; Apparatus For The Detections of Surface Potential, J. of Electro and Chem; vol. 70, No. 2; Jun. 1976; pp. 229-232).

Primary Examiner—Gerard R. Strecker
Attorney, Agent, or Firm—Christel, Bean & Linihan

[57] ABSTRACT

An electrostatic voltmeter including a probe having a detector which is resistively coupled into a region bearing ionized air and an electrostatic field or potential to be measured. An ionization source in the form of a radioactive material is carried by the probe housing and ionizes the air in the region of the detector to provide an ionic current flow into the detector in response to the measured electrostatic field or potential. The electrostatic voltmeter further comprises an amplifier having an input and an output and connected for unity gain, the amplifier input being coupled to the detector. The amplifier has a feedback path connected as a voltage reference for the detector to cause the ionic current flow to change in a manner which will drive the amplifier and feedback to reduce the electrostatic field in the vicinity of the detector to zero. When the detector is positioned in non-contacting proximity to a surface bearing a field or potential to be measured, ionic current flows into the detector and drives the amplifier and feedback in a manner reducing the field and therefore the potential difference between the detector and surface to zero so that the amplifier output voltage is driven to the same potential as that on the surface. The electrostatic voltmeter can be employed in an electrostatic control system characterized by relatively fast response.

17 Claims, 4 Drawing Figures

D.C. ELECTROSTATIC VOLTAGE FOLLOWER HAVING ION-COUPLED PROBE

BACKGROUND OF THE INVENTION

This invention relates to the electrical measurement art, and more particularly to a new and improved electrostatic voltmeter.

An electrostatic voltmeter is an instrument which measures electrostatic fields and electrostatic potentials on surfaces in a non-contacting manner, and such instruments include a probe or sensor assembly and an associated voltmeter circuit. This has been implemented by capacitive coupling between a detector surface in the probe and a surface bearing the field or potential being measured and by modulation of the capacitive coupling. The modulation has been performed by reciprocating the detector surface in a direction normal to the test surface, moving the detector surface into and out of registry with an aperture facing the test surface, or moving an interceding element to alternately expose and shield the detector surface with respect to the test surface.

Electrostatic voltmeters of this type are relatively expensive to manufacture because the mechanical arrangements needed for effecting capacitance modulation require relatively sophisticated manufacturing techniques and because the voltmeter systems must include a driver system for the mechanical modulator system and a demodulator for detecting the capacitively induced signals at the probe. Such mechanical arrangements with moving parts also present potential reliability problems. In addition, such electrostatic voltmeters of the modulated detector type are subject to a bandwidth limitation according to the Nyquist Sampling Theorm which limits the bandwidth of a sampling system to a maximum of one-half the sampling rate.

SUMMARY OF THE INVENTION

It is, therefore, an object of this invention to provide a new and improved electrostatic voltmeter of the non-contacting type.

It is a further object of this invention to provide such a voltmeter wherein modulation is not employed.

It is a further object of this invention to provide such a voltmeter of increased bandwidth.

It is a further object of this invention to provide such a voltmeter of relatively simple construction which is convenient and economical to manufacture and which is highly effective and reliable in operation.

It is a further object of this invention to provide such a voltmeter in an electrostatic control system thereby providing increased speed of system response.

The present invention provides an electrostatic voltmeter comprising a probe including a support in the form of a housing, a detector carried by the support and adapted to be exposed to an electrical field or potential associated with a surface, and means carried by the support for establishing an ionic current flow into the detector in response to the electric field or potential associated with the surface. The means for establishing an ionic current flow preferably comprises an element of radioactive material carried by the support and having sufficient activity to ionize the air in the region between the detector and the test surface to a degree adequate to provide a low resistance path into the detector for the ionic current flow. The voltmeter further comprises an amplifier having an input and an output and having a high input impedance, the amplifier input being coupled to the detector. The amplifier has a feedback path which causes the flow of current into the detector to drive the amplifier in a manner reducing the difference in potential between the detector and the surface to zero so that the amplifier output voltage is driven to the same magnitude and polarity as the potential on the surface. The electrostatic voltmeter of the present invention can be employed in an electrostatic control system in a manner resulting in increased speed of system response.

The foregoing and additional advantages and characterizing features of the present invention will become clearly apparent upon a reading of the ensuing detailed description together with the included drawing wherein:

DETAILED DESCRIPTION OF THE ILLUSTRATED EMBODIMENTS

In a basic non-contacting electrostatic voltmeter, a detector is capacitively coupled to a surface bearing an electric field or potential to be measured, the capacitive coupling is modulated such as by moving the detector relative to the test surface, and a demodulator is employed for detecting the capacitively induced signals on the detector. In accordance with the present invention, an electrostatic voltmeter is employed wherein the need for modulation is avoided thereby eliminating the need for mechanical drivers and demodulator circuitry, and this is accomplished by employing resistive coupling of a detector into a region bearing air ions and the electrostatic field or voltage to be measured. The electrostatic voltmeter comprises a probe including a housing, a detector in the form of a voltage sensitive electrode of metal or like conducting material which is carried by the housing and adapted to be exposed to an electrical field or potential to be measured which is associated with a test surface, and means carried by the housing for establishing an ionic current flow to the detector in response to the electric field or potential of the surface. One form of the latter is an element of radioactive material carried by the housing and having sufficient activity to ionize the air in the region between the detector and the test surface to a degree sufficient to provide a low resistance path into the detector for the ionic current flow. The detector and radioactive element can be combined in an assembly including a disc-like element of metal such as silver, a suitable stable isotope serving as an alpha emitter and also being generally disc-shaped and placed face-to-face against the silver disc, and a relatively thin overlay of gold along the other surface of the radioactive disc and around the edges thereof, the silver disc and gold overlay serving in combination as the detector. The electrostatic voltmeter further comprises an amplifier having an input and an output, and the amplifier input is coupled to the detector. The amplifier has an ultra high input impedance and preferably is connected for unity gain. The amplifier has a feedback path which functions as a voltage reference for the detector which causes the flow of ionic current into the detector to drive the amplifier in a manner reducing the difference in potential between the detector and the test surface to zero so that the amplifier output voltage is driven to the same magnitude and polarity as the potential on the test surface. In other words, when the voltage at the amplifier output is unequal to the voltage on the test surface, current flows into the detector until the amplifier output voltage is equal to the voltage on the surface and when the voltages are equal the current flow reduces to an amount necessary to maintain the voltage on the amplifier output also across the effective resistance of the amplifier input. The electrostatic voltmeter of the present invention can be employed in a closed loop electrostatic control system with the result that the system has a much faster speed of response.

Figure 1:
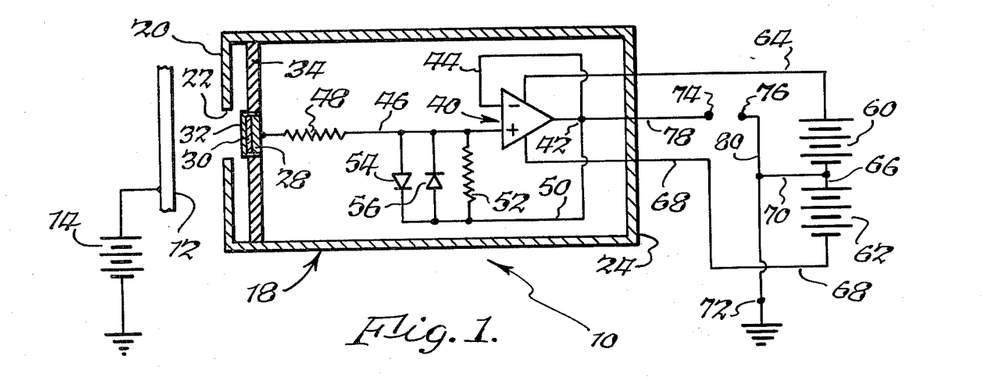
FIG. 1 is a diagrammatic view of an electrostatic voltmeter according to the present invention.

Referring now to FIG. 1, an electrostatic voltmeter 10 according to the present invention is illustrated diagrammatically adjacent a test surface 12 bearing a voltage or potential 14. The electrostatic voltmeter 10 comprises a probe or sensor including a housing 18 which in the device shown is hollow cylindrical in shape having a first end surface 20 provided with an opening or aperture 22 therethrough. Housing 18 can be of various suitable materials and preferably is of metal. Aperture 22 typically is circular in shape but can have other shapes as well. Housing 18 has an opposite end surface 24 which is closed and is provided with an opening or openings (not shown) for passage therethrough of electrical leads which will be described in further detail presently.

The electrostatic voltmeter of the present invention further comprises a detector adapted to be exposed to an electrical field or potential to be measured which is associated with a surface such as the test surface 12. In the system shown the detector is carried by the housing 18 which serves as a support for the detector in a manner which will be described. The electrostatic voltmeter of the present invention further comprises means operatively associated with the detector for establishing an ionic current flow into the detector in response to the electric field or potential associated with the surface, such as test surface 12. In the system shown the means for establishing the ionic current flow also is carried by the housing 18 which serves as a support for the same. The means for establishing an ionic current flow serves to ionize the air in the region between the detector and the surface 12 to a degree sufficient to provide a low resistance path between the detector and the region between the detector and surface bearing the air ions and the field or potential associated with surface 12. In particular, a cloud of positive and negative air ions is provided in the region between detector and test surface which in the absence of an electric field results in zero net charge and no net current flow. When an electric field is present due to a difference in potential between detector and test surface, the positive ions move in a direction to the relatively negative potential and the negative ions move in a direction to the relatively positive potential thereby causing a net current flow between detector and test surface with the ions serving as charge carriers. One form of means for establishing an ionic current flow found to perform satisfactorily is an element of radioactive material having sufficient activity to ionize the air in the region between the detector and surface 12.

By way of illustration, the detector and the radioactive element can be combined in an assembly including a generally disc-shaped element 28 of electrically conducting material, preferably a disc of silver having a thickness of about 0.007 inch and an overall diameter of about 0.20 inch. An element 30 of radioactive material is placed against one of the faces of element 28 and located in the housing 18 so as to be facing toward the surface 12, i.e. through the aperture 22. The element 30 also is in the form of a disc having a diameter substantially equal to that of element 28 and having a thickness of about 20 millionths of an inch. One form of element 30 found to perform satisfactorily is Americium 241 which is a man-made element in the form of a stable isotope having a half life of about 433 years and which behaves as an alpha emitter. Americium 241 is commercially available from Nuclear Radiation Developments of Grand Island, New York. The assembly is completed by a partial overlay or layer 32 of electrically conductive material, preferably gold, on the outer surface of element 30 and extending around the marginal or peripheral edges of both elements 28 and 30. The gold layer 32 also has a thickness of about 20 millionths of an inch. The entire combination of the components 28, 30 and 32 can be manufactured simply by providing sheets of the three elements in a stack, and then by virtue of a single punching operation the assembly shown in FIG. 1 can be formed, the punching operation also simultaneously forming the gold overlay to seal the edges. The combination of the three components 28, 30 and 32 can be held in the housing 18 by various suitable arrangements, one of which is a disc-shaped member 34 of electrically insulating material having an outer diameter substantially equal to the inner diameter of housing 18 and fixed in the housing in a plane generally perpendicular to the longitudinal axis thereof. Member 34 is located adjacent the aperture 22 and provided with a central opening into which the combination 28, 30 and 32 is snugly fitted. Other mounting arrangements can of course be employed.

In the device shown, the glod overlay 32 is pervious or transparent to the alpha particles or radiation emitted by the radioactive material 30. The combination of the gold overlay 32 and silver disc 28 comprises a voltage sensitive electrode whereby electrons of the afore-mentioned ionic current flow are conducted by the gold overlay 32 to the silver disc 28. The material 30 can comprise other alpha emitters such as Polonium 210, Radium and Cobalt 60, to mention a few. In addition, it is possible to achieve ion flow into the detector in response to the field or potential of the test surface 12 by introducing ions into the region between the detector surface and test surface 12 by other means. In particular, ions generated remotely from the area of the detector and test surface 12 could be transported to this area for use therein. For example, a field generating device such as an air ion generator could be located remote from the probe and test surface 12, and the output of the generator transported by a suitable conduit such as a plastic tube operatively associated with an ion pump to the area of the detector and test surface 12. The conduit or plastic tube would be supported or carried at one end by the housing 18. In this instance the detector would then comprise the single electrode element 28 of silver or like electrical conducting material. The output end of the conduit carried by the housing 18 then would be located adjacent the region between the detector and test surface 12.

The electrostatic voltmeter of the present invention further comprises an amplifier generally designated 40 having an input and an output, a feedback path, and a high input impedance. The amplifier also preferably is connected for unity gain, in particular connected as a voltage follower. The electrostatic voltmeter also includes means for coupling the detector to the input of the amplifier. In particular, amplifier 40 has an output terminal designated 42 which is connected by a line 44 to the negative input terminal of amplifier 40. The positive input terminal of amplifier 40 is connected by means including line 46 and a resistor 48 to the detector element 28. The output terminal 42 also is connected by means of a line 50 and a resistor 52 to the positive input terminal of amplifier 40. A pair of protective diodes 52 and 56 are connected in parallel and oppositely poled relation across resistor 52. Bias voltage for operating the amplifier 40 is derived from a pair of series-connected voltage sources in the form of batteries 60, 62. The positive terminal of battery 60 is connected by a line 64 to one bias terminal of amplifier 40, the negative terminal of battery 60 is connected by a line 66 to the positive terminal of battery 62, and the negative terminal of battery 62 is connected by a line 68 to other bias terminal of amplifier 40. Line 66 is connected by a line 70 to a circuit electrical ground or reference terminal 72. The output of the electrostatic voltmeter of FIG. 1 is available on a pair of output terminals 74, 76, terminal 74 being connected by a line 78 to the amplifier output terminal 42 and terminal 76 being connected by a line 80 to the circuit ground or electrical reference terminal 72.

The system of FIG. 1 operates in the following manner. The probe is moved into position with the detector electrode combination 32, 28 and the ionization source 30 facing a surface such as the test surface 12 bearing the electrostatic field or potential to be measured. The air in the region in front of the detector, i.e. to the left thereof as viewed in FIG. 1, is ionized to provide a low resistance path between the ionized region and the detector. Amplifier 40 has an ultra high input resistance on the order of $10^{15}$ ohms, and the low resistance path between the detector and ionized air region is low as compared to $10^{15}$ ohms. This low resistance path, in turn, will allow an ionic current flow into the detector and ultimately the ultra high input impedance amplifier 40. This ionic current flow drives amplifier 40 in a direction and to a magnitude tending to reduce the field, i.e. the potential difference, between the detector and the test surface 12 to zero, and therefore tending to reduce the ionic current flow into the detector to zero. In this way, the detector and amplifier system is driven to the same potential as the measured unknown associated with the surface 12. The system of the present invention employs feedback from a low impedance source having a magnitude and polarity which are equal to those of the measured unknown. This bootstrapping technique drives the effective loading impedance of the probe to a very high value so that there is no loading of the surface 12 being measured. In particular, in the circuit shown in FIG. 1, the effective input resistance is driven to a value greater than $10^{15}$ ohms. This ultra high resistance would require only a current flow of $10^{-12}$ amperes into the detector when the surface has a potential of 1000 volts. Additionally, the bootstrapping technique reduces the input capacitance of the probe to approximately $10^{-16}$ farads. This ultra low capacitance will allow a small current flow, i.e. an ionic current flow, to effect a large slew rate, i.e. the ability of the probe and the follower amplifier 40 to go to a new reading. The foregoing is described further by the following equation:

$$dV/dt = i/c$$

where $dV/dt$ is the rate of change of voltage across the input capacitance of the system including the detector and amplifier 40, i is the magnitude of the available current due to the activity of the ionization source, and C is the effective input capacitance of the detector and amplifier system. If C is held to very low values, very high values of $dV/dt$ can be obtained for any given ionic current. In other words, for a very small amount of ionic current flow into the detector, the foregoing feedback technique allows the follower amplifier to follow the voltage or potential on the test surface very faithfully thereby providing very high sensitivity.

In the circuit of FIG. 1, resistor 48 and diodes 54, 56 form an input protection circuit which protects the positive input of amplifier 40 from being overstressed due to input transients. Resistor 52 is a return impedance for the positive input bias current of amplifier 40. When the amplifier is of the field effect transistor type, the bias current to the positive input should be less than $10^{-14}$ amperes. The combination of diodes 54, 56 and resistor 52 are returned to the output of amplifier 40 by means of line 50, amplifier 40 being connected for unity gain by mens of line 44 from the output to the negative input and this provides for the bootstrapping action described above. If amplifier 40 were not connected for unity gain, then the feedback path along line 50 would have a gain of 1/G where G is the gain of amplifier 40. Power for the follower amplifier 40 is provided by the positive and negative voltage supplies 60, 62.

If the output of amplifier 40 which is available across terminals 74, 76 in FIG. 1 is not equal to the potential on test surface 12, a current flows into the detector in response to the field generated by the potential difference between the detector and test surface 12 until the output of amplifier 40 is at the same potential as the test surface. When the voltages or potentials are equal the ionic current flow will reduce to a magnitude of current necessary to maintain the output voltage of amplifier 40 across the effective input resistance of the input of amplifier 40. The effective input resistance is equal to the value of resistor 52 multiplied by the gain factor of amplifier 40. This can be expressed by the following equation: $R\text{input} = (\text{resistor } 52)(1)/10^{-5}$. According to this equation, $R\text{input}$ is approximately equal to $10^{15}$ ohms when resistor 52 has a magnitude of $10^{10}$ ohms. The effective input capacitance is equal to the value of the input capacitance multiplied by the inverse gain factor of amplifier 40. This can be expressed by the following equation: C input eff. $= (\text{Cin})(1)/10^5$.

According to this equation, C input eff. is approximately equal to $10^{-16}$ farad when Cin has a magnitude of $10^{-11}$ farad, Cin being the input capacitance due to the capacitance of diodes 54, 56, resistor 52 and any stray capacitance.

The use of the follower amplifier 40 with the ion-coupled detector causes the detector to be driven by the amplifier feedback to the same potential as the test surface 12 thereby reducing the ion flow between the test surface and the detector to just that value needed to satisfy the leakage of the follower. An advantage of this is that the resulting or equilibrium ion current flow is relatively small. This, in turn, reduces the required amount of ionized media for satisfactory performance. As a result, system accuracy is obtainable with a relatively low activity radioactive source. Another advantage of the relatively small ion current flow is that when surface 12 is a sensitive photo receptive surface, it will not be discharged.

By way of further illustration, by virtue of the amplifier 40 being a follower amplifier with feedback, the effective input impedance is increased by a factor equal to the ratio of the open loop follower gain to the closed loop followerr gain. It is reasonable to assume an open loop gain of 100,000 and because the closed loop gain is unity, the input impedance of the follower is raised to 100,000 times its value without feedback. In effect, this reduces the ion current necessary to drive the input of the follower to the measured value on the test surface therefore reducing the strength or activity of the radioactive source or other ion generator by the same factor of 100,000. If a radioactive source is used, this magnitude of reduction in activity renders the equipment safe from the standpoint of personal health, non-destruction of the surface under test, and no generation of excessive numbers of free ions to otherwise migrate and cause leakages in other parts of the system.

A primary advantage of the electrostatic voltmeter of the present invention is that with the detector being resistively coupled to a region containing air ions and the electrostatic field or potential to be measured there is no need to employ modulation. In particular, in prior art capacitive coupling schemes it is necessary to vary or modulate the capacitive coupling between detector and test surface at a fixed rate in order to induce a voltage on the detector which can provide an indication of the magnitude and polarity of the potential on the test surface. This is avoided by the resistive coupling in the electrostatic voltmeter of the present invention. The system of the present invention avoids the need to provide mechanisms for moving the detector relative to the test surface for modulation and furthermore avoids the need for providing any demodulators. As a result the expensive mechanisms of the prior art are avoided. In addition, the bootstrapping action of the amplifier feedback path together with unity gain connection enables the electrostatic voltmeter of the present invention to utilize the foregoing advantages of resistive coupling in a manner which does not load the test surface being measured. Thus, a non-contacting electrostatic voltmeter is provided which is extremely simple in construction, convenient and economical to manufacture and highly effective and reliable in operation. Another advantage of the electrostatic voltmeter of the present invention is that since it does not employ modulation is not a sampling type system and accordingly the bandwidth limitation imposed by the Nyquist Sampling Theorm is avoided. The system of the present invention has relatively high bandwidth and high speed capacity.

Figure 2:
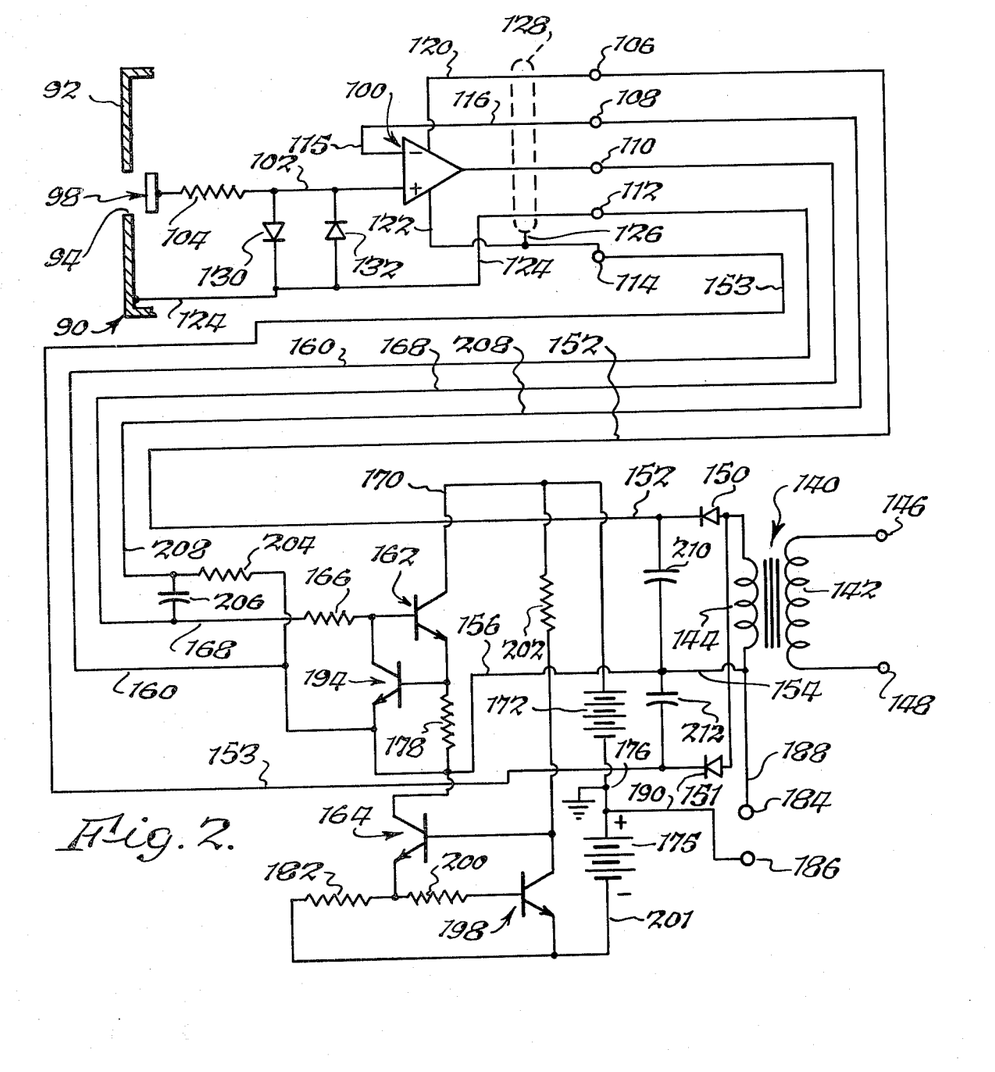
FIG. 2 is a schematic circuit diagram of an electrostatic voltmeter according to another embodiment of the present invention.

FIG. 2 illustrates an electrostatic voltmeter according to another embodiment of the present invention. The system shown in FIG. 2 has high voltage capability so that it can follow the full range of voltages on a test surface (not shown) and it has stability from high frequency oscillations. The electrostatic voltmeter includes a probe having a housing shown in fragmentary form at 90 which in the device shown is hollow cylindrical shape as in the system of FIG. 1 and has an operative end surface 92 provided with an opening or aperture 94 therethrough. The operative surface 92 is of a material capable of holding or retaining an electrical potential applied thereto, in particular of electrically conducting material such as metal, and in the device shown the entire housing preferably is of metal. As in the device of FIG. 1, aperture 94 can be circular or of other shapes. In the device shown in FIG. 2, the component shown diagrammatically at 98 represents the combination of detector and radioactive source, i.e. the disc 28, radioactive source 30 and overlay 32 as shown in FIG. 1. The component 98 can be supported within the housing 90 in a manner similar to that of the device of FIG. 1. The opposite end surface of the housing 90 (not shown) is closed and provided with an opening or openings for passage therethrough of electrical leads in a manner similar to that of the device of FIG. 1.

The system of FIG. 2 further comprises an amplifier 100 having an input and an output, a feedback path, and a high input impedance. The amplifier also preferably is connected for unity gain. The positive input of amplifier 100 is connected by means of a line 102 and resistor 104 to the component 98, in a manner similar to the arrangement of FIG. 1. In the system of FIG. 2 there are five terminals designated 106, 108, 110, 112 and 114, and the components to the left of the terminals as viewed in FIG. 2 can be included in the probe housing. The output of amplifier 100 is connected to terminal 110. The negative input terminal of amplifier 100 is connected by a line 115 to the output terminal 108. One bias terminal of amplifier 100 is connected by a line 120 to the output terminal 106, and the other bias terminal of amplifier 100 is connected by a line 122 to the output terminal 114. Output terminal 112 is connected by a line 124 to the operative, conductive surface 92 of the probe housing. Terminal 114 also is connected by a lead 126 to the cable shield designated 128 in FIG. 2. A pair of protective diodes 130, 132 are connected in parallel and reverse poled relation between line 102 and line 124.

The remainder of the circuitry in the system of FIG. 2 can be located in a housing separate from the probe and connected to the terminals 106–114 by means of a five lead cable. The circuit includes means for supplying bias voltage to amplifier 100 in the form of a transformer 140 having a primary winding 142 and a secondary winding 144. Primary winding 142 has a pair of terminals 146, 148 adapted for connection to a standard a.c. line. One terminal of secondary winding 144 is connected to the anode of a rectifying diode 150, the cathode of which is connected by a line 152 to the terminal 106. The same terminal of winding 144 is connected to the cathode of a rectifying diode 151, the anode of which is connected by a line 153 to the terminal 114. The other terminal of secondary winding 144 is connected through lines 154, 156, 158 and 160 to the terminal 112.

The circuit of FIG. 2 further includes coupling means in the output circuit of amplifier 100 and comprising first and second transistors 162 and 164, respectively, which are high voltage transistors which serve to couple from the output of amplifier 100 to give the amplifier an effective voltage range equal to the collector to emitter voltage capability of the transistors 162 and 164. The gase of transistor 162 is connected through a resistor 166 and a line 168 to output terminal 110. The collector of transistor 162 is connected through a line 170 to the positive terminal of a high voltage d.c. source in the form of battery 172, the negative terminal of which is connected through a line 174 to a circuit electrical ground or reference terminal 176. The circuit includes another high voltage d.c. source in the form of battery 175, the positive terminal of which is connected by a line 177 to reference terminal 176. The emitter terminal of transistor 162 is connected through a resistor 178 to line 158. The collector of transistor 164 is connected by a line 180 to the line 156. The emitter of transistor 164 is connected through a resistor 182 to the circuit ground or reference terminal 176.

The output voltage developed by the system of FIG. 2 is available on a pair of output terminals 184, 186. Terminal 184 is connected by a line 188 to the junction of lines 154 and 156, and terminal 186 is connected by a line 190 to the circuit ground or reference terminal 176.

The circuit of FIG. 2 further comprises a current limiting means in the output circuit of amplifier 100 and including a transistor 194 having a base terminal connected to the junction of the emitter terminal of transistor 162 and resistor 178, a collector terminal connected to the base terminal of transistor 162, and an emitter terminal connected to the junction of lines 156 and 158. The provision of transistor 194 limits the current flowing through a load connected to the output terminals 184, 186 and thereby limits dissipation. The output circuit of amplifier 100 also includes means including transistor 198 to increase the negative voltage following capability of the circuit. The base of transistor 198 is connected through a resistor 200 to the emitter of transistor 164. The emitter of transistor 198 is connected by a line 201 to the negative terminal of battery 175, and the collector of transistor 198 is connected to the base of transistor 164 and through a resistor 202 to line 170. A compensation network comprising resistor 204 and capacitor 206 is provided to obtain stability from high frequency oscillations. One terminal of resistor 204 is connected to the junction of lines 158 and 160, and the other terminal of resistor 204 is connected by a line 208 to output terminal 108. Capacitor 206 is connected across lines 168 and 208. A first smoothing capacitor 210 is connected across lines 152 and 156, and another smoothing capacitor 212 is connected across lines 153, 156.

In measuring the potential or voltage associated with a test surface, the portion of the circuit of FIG. 2 including component 98 and amplifier 100 operates in a manner similar to amplifier 40 and the components 28, 30 and 32 in the circuit of FIG. 1. The feedback path includes line 124 and diodes 130, 132, and the leakage resistance of the diodes substitutes for the provision of a resistor such as resistor 52 in the circuit of FIG. 1. The high voltage transistors 162 and 164 are employed to couple from the output of amplifier 100 to give amplifier 100 an effective voltage equal to the collector-emitter voltage capability of the transistors 162, 164. The positive and negative bias voltages for amplifier 100 derived from transformer 140 and rectifiers 150, 151 are returned to the output at terminals 184, 186 to cause amplifier 100 to experience no common mode stresses, and this further increases the bootstrapping action by reducing the physical input capacitance of amplifier 100. Returning the positive and negative bias voltages to the output also reduces the common mode effects of amplifier 100 which would otherwise limit the gain.

By way of illustration, in the circuit of FIG. 2, resistor 104 has a magnitude of about 100 kilohms, amplifier 100 is a field effect transistor operational amplifier with common mode voltage to include the negative supply rail, capacitor 206 has a magnitude of about 0.22 microfarad, resistance 204 is about 6.8 kilohms, resistor 166 is about 2.7 kilohms, resistor 178 has a magnitude of about 680 ohms, resistor 182 is about 2.7 kilohms, resistor 200 is about 1.0 kilohm, and resistor 202 has a magnitude of about 10 megohms. The d.c. sources 172 and 175 provide about 500 volts each, and the voltage on line 152 is about 10 volts positive with respect to the voltage on line 156, and the voltage on line 153 is about 10 volts negative with respect to the voltage on line 156. The transistors 162, 164 are of the high voltage type, and the transistors 194, 198 can be of the low voltage type. To provide a voltmeter which follows only positive high voltages, the high voltage supply 175 can be eliminated and the emitter of transistor 198 connected to the circuit ground or reference terminal 176. Likewise, supply 172 could be eliminated and line 170 connected to ground or reference terminal 176 to provide a voltmeter with only negative voltage capability.

Figure 3:
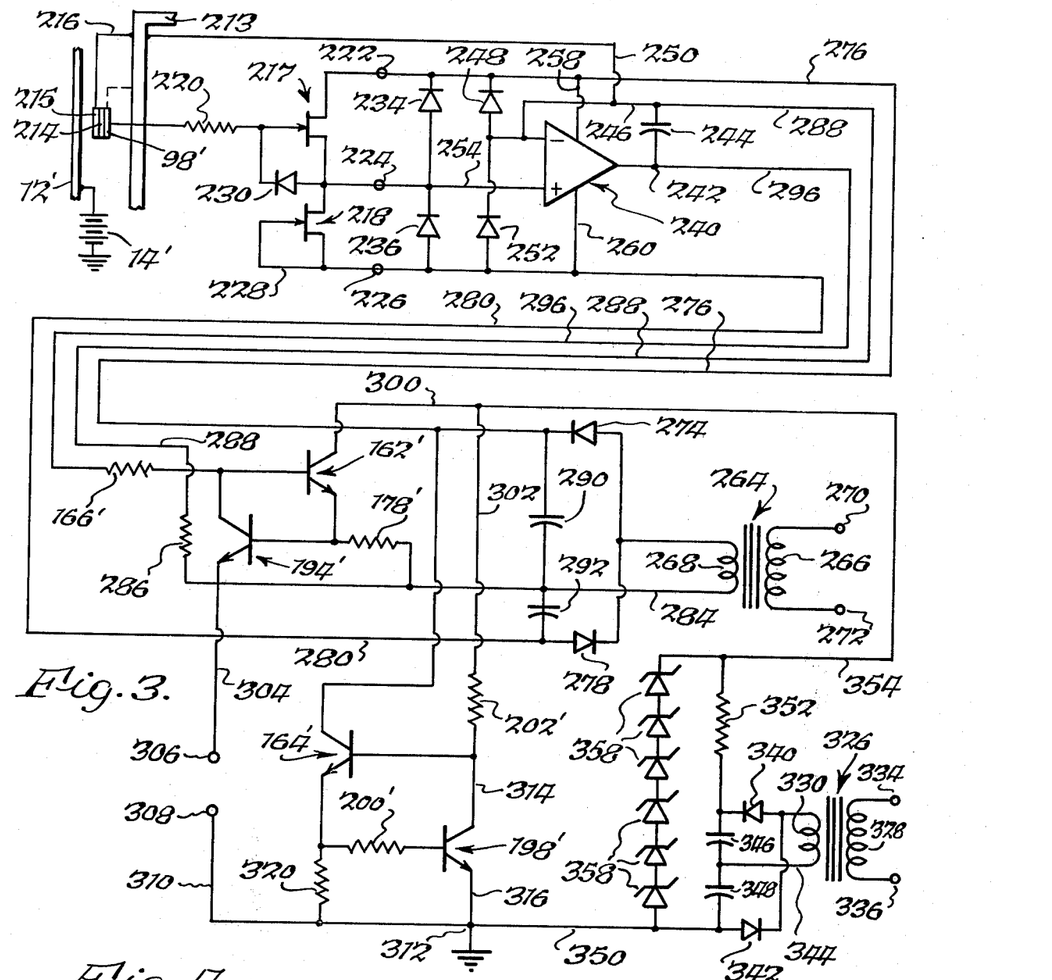
FIG. 3 is a schematic circuit diagram of an electrostatic voltmeter according to another embodiment of the present invention.

FIG. 3 shows an electrostatic voltmeter according to another embodiment of the present invention. In the voltmeter of FIG. 3, a component 98' similar to detector 98 in the embodiment of FIG. 2, is positioned outside of the probe housing. In particular component 98' is held by suitable means designated by the broken line in FIG. 3 in spaced adjacent relation to an electrically conductive end surface 213 of the probe housing. One surface of component 98' faces surface 213, and the opposite surface of component 98' contacts a layer 214 of insulating material. The outer surface of layer 214 is in contact with a body 215 of electrically conducting material such as a suitable metal. The outer surface of body 215 is shown in FIG. 3 facing a test surface 12' bearing a voltage or potential 14'. Conducting surface 215 is connected by a line 216 to the surface 213. Since component 98' is in a position facing surface 213 it cannot irradiate the test surface 12' with ions. A potential difference between test surface 12' and housing surface 213 will produce an electric field in the region therebetween. The field, in turn, will cause the air ions between the surface of component 98' and housing surface 213 to migrate as in the embodiment of FIG. 1 causing a flow of electrical current into component 98' in response to the electric field. The foregoing arrangement prevents the component surface 98' from coupling atomic particles to the test surface 12'.

In the circuit of FIG. 3, in order to increase current sensitivity and decrease the loading effect of the follower amplifier on the detector surface, a preamplifier is employed to drive the operational amplifier, the combination of preamplifier and operational amplifier being connected as a voltage follower. In particular, the probe includes a preamplifier comprising a pair of field effect transistors 217 and 218. The gate terminal of transistor 217 is connected through a resistor 220 to the component 98'. The source and drain terminals of transistor 217 are connected to corresponding ones of a pair of terminals 222 and 224. The source and drain terminals of transistor 218 are connected across terminal 224 and a third terminal 226, the latter terminal also being connected to the gate terminal of transistor 218 by a line 228. The circuit also includes a field effect diode 230, the anode of which is connected to terminal 224 and the cathode of which is connected to the gate terminal of field effect transistor 216. A first protective diode 234 is connected across the terminals 222, 224 and a second protective diode 236 is connected across the terminals 224, 226.

The system of FIG. 3 further comprises an operational amplifier 240 which in combination with the preamplifier forms an amplifier having an input and an output, a feedback path, and preferably is connected for unity gain, in particular connected as a voltage follower. The output terminal 242 of the amplifier 240 is connected through a capacitor 244 and a line 246 to the negative input terminal of amplifier 240. The negative input terminal also is connected to the anode of a protective diode 248, the cathode of which is connected to terminal 222. The negative input terminal of amplifier 240 also is connected by a line 250 to the conductive surface 213 of the probe housing. The circuit includes another protective diode 252, the cathode of which is connected to the negative input terminal of amplifier 240 and the anode of which is connected to terminal 226. The positive input terminal of amplifier 240 is connected by a line 254 to the terminal 224. One bias terminal of amplifier 240 is connected by a line 258 to the terminal 222 and the other bias terminal of amplifier 240 is connected by a line 260 to the terminal 226.

The circuit of FIG. 3 also includes means for supplying bias voltage to amplifier 240 in the form of a transformer 264 having primary and secondary windings 266 and 268, respectively. Primary winding 266 includes a pair of terminals 270, 272 adapted for connection to a standard a.c. line. One terminal of secondary winding 268 is connected to the anode of a rectifying diode 274, the cathode of which is connected by a line 276 to line 258 and thus to the one bias terminal of amplifier 240. This same terminal of transformer secondary winding 268 also is connected to the cathode of another rectifying diode 278, the anode of which is connected by a line 280 to line 260 and thus to the other bias voltage terminal on amplifier 240. The other terminal of transformer secondary winding 268 is connected by a line 284 to one terminal of a resistor 286, the other terminal of which is connected by a line 288 to the junction of line 246 and a terminal of capacitor 244. A first smoothing capacitor 290 is connected between the cathode of diode 274 and line 284, and a second smoothing capacitor 292 is connected between line 284 and the anode of diode 278.

The circuit of FIG. 3 includes a pair of transistors 162' and 164' which function to provide a voltage capability in a manner similar to transistors 162 and 164 of the circuit of FIG. 2. In this connection, the base terminal of transistor 162' is connected to one terminal of a resistor 166', the other terminal of which is connected through a line 296 to the output terminal 242 of amplifier 240. The emitter terminal of transistor 162' is connected through a resistor 178' to line 284. The collector terminal of transistor 162' is connected by a line 300 to other portions of the circuit in a manner in which will be described. The base terminal of transistor 164' is connected to one terminal of a resistor 202' the other terminal of which is connected by a line 302 to the line 300. The circuit of FIG. 3 also includes a transistor 194' which provides a current limiting function in a manner similar to transistor 194 of the circuit of FIG. 2. The base terminal of transistor 194' is connected to the emitter terminal of transistor 162', the collector terminal of transistor 194' is connected to the base terminal of transistor 162', and the emitter terminal of transistor 194' is connected by a line 304 to a circuit output terminal 306. Another circuit output terminal 308 is connected by a line 310 to a circuit ground or reference terminal 312.

The circuit of FIG. 3 also includes a transistor 198' which functions in a manner similar to transistor 198 of the circuit of FIG. 2. The base terminal of transistor 198' is connected through a resistor 200' to the emitter terminal of transistor 164'. The collector terminal of transistor 198' is connected by a line 314 to the base terminal of transistor 164'. The emitter terminal of transistor 198' is connected by a line 316 to the circuit ground or reference terminal 312. The junction of the emitter of transistor 164' and resistor 200' is connected through a resistor 320 to the circuit ground or reference terminal 312.

The circuit of FIG. 3 further comprises a regulated high voltage d.c. source comprising a transformer 326 having a primary winding 328 and secondary winding 330. Primary winding 328 includes a pair of terminals 334, 336 adapted for connection to a standard a.c. line. Secondary winding 330 is connected to a half wave rectifier comprising a first diode 340, the anode of which is connected to one terminal of winding 300, and a second diode 342 the cathode of which is connected to the same terminal of winding 330. The other terminal of winding 330 is connected by a line 344 to the junction of a pair of smoothing capacitors 346, 348 connected between the cathode of diode 340 and the anode of diode 342. The junction between the anode of diode 342 and capacitor 348 is connected by a line 350 to the circuit ground or reference terminal 312. The junction between the cathode of diode 340 and capacitor 346 is connected to one terminal of a resistor 352, the other terminal of which is connected by a line 354 to the junction of lines 300, 302. A series combination of a plurality of Zener diodes, each designated 358, is connected between lines 354 and 350, i.e. across the combination of capacitors 346, 348 and resistor 352.

The system of FIG. 3 is used in a manner similar to the system of FIG. 2 in measuring the potential or voltage associated with a test surface. The portion of the system to the left of terminals 222, 224 and 226 as viewed in FIG. 3 are included in a probe housing in a manner similar to the preceding embodiments, and the remainder of the system can be included in a separate housing connected to the probe by a four lead cable. Transistors 216 and 218 comprise a preamplifier for driving amplifier 240 and which serves to increase the current sensitivity of the system and decrease any loading effect of the follower amplifier 240 on the detector surface. To increase the overall bandwidth capability of the system, amplifier 240 can be of the high bandwidth type.

By way of illustration, in the circuit of FIG. 3, resistor 220 has a magnitude of about 10 kilohms. Capacitor 244 and resistor 286, which comprise a compensation network to provide stability from high frequency oscillations, have magnitudes of about 0.22 microfarad and about 6.8 kilohms, respectively. Resistor 166' has a magnitude of about 2.7 kilohms, resistors 178' and 320 each a magnitude of about 680 ohms, resistor 200' a magnitude of about 1 kilohm, and resistor 202' a magnitude of about 10 megohms. Capacitors 290, 292 each have a magnitude of about 50 microfarads and a rating of about 10 volts. Transformer 264 steps down the line voltage to a magnitude of about five volts. Transformer 326 steps up the line voltage such that the voltage at the junction of capacitor 346 and the cathode of diode 340 is about 1700 volts with respect to ground terminal 312. Capacitors 346 and 348 each have a magnitude of about 0.1 microfarad, and resistor 352 has a magnitude of about 270 kilohms. Zener diodes 358 regulate the voltage across the series combination of capacitors 346, 348 and resistor 352 to about 1200 volts.

Figure 4:
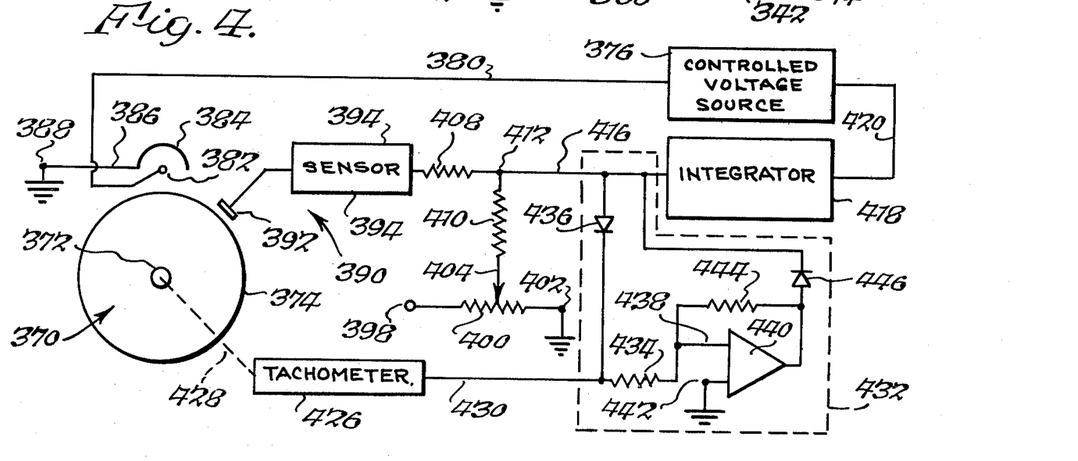
FIG. 4 is a diagrammatic view of an electrostatic control system including the electrostatic voltmeter of the present invention.

FIG. 4 illustrates an electrostatic control system in which the electrostatic voltmeter of the present invention is employed. The system of FIG. 4 includes a surface bearing a potential to be controlled, and in the present illustration the surface is defined by a drum 370 rotatably about the axis of a shaft 372 and having an outer surface 374 bearing the potential to be controlled. Drum 370 can be the drum of electrophotographic apparatus, commonly known as Xerographic apparatus, wherein surface 374 is photosensitive. The system further comprises controlled means for applying potential to surface 374 in the form of a controlled voltage source 376 having an input and an output. The output of source 376 is connected by a line 380 to an electrode located in proximity to drum 370. A shield 384 is associated with electrode 382 and connected by a line 386 to a circuit ground or reference terminal 388. In xerographic apparatus, the foregoing commonly is called a corotron, which is a linear charge generator, and the relative velocity between the corotron and drum surface determines the resultant surface charge density. This surface charge density and the thickness and composition of the material of the surface to be charged, determines the voltage on the surface immediately prior to imaging, and a reproducible copy can be produced if a constant voltage is accepted on the photosensitive surface immediately prior to imaging. The control system of the present invention comprises means generally designated 390 for sensing the actual instaneous potential on surface 374. The sensing means comprises a detector adapted to be exposed to the electrical potential on or associated with surface 374, means operatively associated with the detector for establishing an ionic current flow between the detector and surface 374 to provide resistive coupling of the detector to the surface 374, and circuit means connected to the detector for providing an output voltage equal in magnitude and polarity to the potential associated with the surface 374. In the system shown, the sensing means 390 comprises the combination of a probe or sensor designated 392 and circuitry designated 394 which combination is the electrostatic voltmeter of the present invention. Any of the electrostatic voltmeters shown in FIGS. 1-3 can be employed, the circuit of FIG. 3 being preferred.

The circuit of FIG. 4 also includes means for establishing a reference potential or voltage indicative of the desired potential on surface 374. A terminal 398 is adapted for connection to a d.c. source of predetermined magnitude (not shown), and terminal 398 is connected through a potentiometer 400 to a circuit ground or reference terminal 402. The wiper arm 404 of potentiometer 400 can be adjusted to set the desired reference voltage. The control system of the present invention further comprises control means connected to the sensing means 390 and connected in controlling relation to the electrical potential applying means 376-384 for comparing the output voltage of the sensing means 390 to the reference voltage and controlling the operation of the potential applying means in accordance with the result of the voltage comparison. The output of sensor 390, for example output terminal 306 in the apparatus of FIG. 3, is connected to one terminal of a resistor 308, the other terminal of which is connected through a resistor 410 to the potentiometer wiper arm 404. Resistors 408 and 410 are proportioned such that the voltage at the junction 412 thereof will go to zero when the output voltage of the sensor 390 is equal to the reference voltage set by the potentiometer 400. The terminal 412 is connected by a line 416 to the input of an integrating amplifier 418, the output of which is connected by a line 420 to the input of the controlled voltage source 376. Integrating amplifiers are of course well known and are characterized by an output which changes with time in response to an input and further by operation which has a memory or storage capability with respect to the previous input. Briefly, integrating amplifier 418 can comprise an operational amplifier having a feedback capacitor connected between the output and input thereof and an input resistor connected to the amplifier input. The magnitude of the capacitor is selected to optimize speed of system response, taking into account the geometry and speed of rotation of drum 370.

The control system of FIG. 4 operates in the following manner. The desired potential or voltage for drum surface 374 is established by adjusting the wiper arm 404 of potentiometer 400. The actual voltage or potential on drum surface 374 is determined by the sensor 390 which operates in a manner similar to the embodiments of FIGS. 1-3, with the result that sensor 390 provides an output voltage equal to or proportional to the potential or voltage on surface 374. If the actual surface potential varies from the desired value, the voltage on terminal 412 will deviate from zero and allow a potential to appear at the input of the integrating amplifier 418. The output of amplifier 418 will change with time to cause the controlled voltage source 376 to change the potential applied to surface 374 through corona electrode 382, i.e. increase or decrease the potential, in a manner such that the actual potential on surface 374 equals the desired potential.

The control system of the present invention has the advantages of the electrostatic voltmeter of the previous embodiments: namely, elimination of the need for a modulator and a demodulator in the sensor and avoidance of the bandwidth limitation imposed by the Nyquist Sampling Theorm. Thus, the system is low in cost, requires relatively small space, provides solid state reliability by eliminating the mechanical modulator from the sensor probe, and is immune to mechanical shock and vibration.

Another important advantage of the control system of the present invention is that sensor 390, in particular the probe 392 thereof, can be located along surface 374 relatively close to the corona electrode 382 thereby providing a control system with a relatively high frequency response. Sensor 390 operates by ionizing the air in the region or space between the detector in probe 392 and the surface 374. The introduction of more ions in that region or space due to close proximity to the corona electrode 382, which generates air borne ionized gas, does not impair operation of sensor 390. Thus the spatial separation between the detector in probe 392 and corona electrode 382 can be minimized thereby minimizing the time lag in control system response. Also, the detector of probe 392 normally is spaced about $\frac{1}{8}$ inch to about $\frac{1}{4}$ inch from surface 374.

Typically, probe 392 will not be located along surface 374 at the exact location where potential is applied by electrode 382 but instead will be spaced therefrom a slight distance along surface 374. As a result, there will be a slight time lag between the drum voltage generated directly at corona electrode 382 and the voltage at the measuring probe 392. This time lag will vary as a function of the speed of movement of surface 374 relative to the electrode and probe, i.e. as a function of the speed of rotation of drum 370. In order to obtain the fastest possible closed loop response, it would be desirable to allow the voltage a terminal 412, which voltage represents the difference between the desired and measured potentials of surface 374, to be limited or bounded at voltage levels which are proportional to drum or surface velocity. This in turn is desirable to change the time response of the control loop to track the time lag in the feedback signal, i.e. from electrode 382 to surface 374 to sensor 390. The foregoing is illustrated further in the following table.

TABLE I

| Drum surface velocity | Time lag in control loop | Desired speed of integrator | Required voltage at terminal 412 |
|---|---|---|---|
| 15 inches/sec. | 0.010 sec. | 10 volts/sec. | 10 volts |
| 7.5 inches/sec. | 0.020 sec. | 5 volts/sec. | 5 volts |

Thus, if the drum speed decreases by a factor of two, the maximum rate of change of the integrating amplifier 418 should be reduced by two in order to effectively prevent overshoot in the drum or surface potential.

In order to limit or bound the voltage on terminal 412, a voltage proportional to the velocity of surface 374, i.e. proportional to the speed of rotation of drum 370, is connected to a bounding circuit between terminal 412 and the integrating amplifier 412. This increases the closed loop response of the system by controlling the maximum rate of change of the integration performed by amplifier 418 as determined by the speed or velocity of surface 374. There is provided a d.c. tachometer generator or the like 426 for converting movement of surface 374, i.e. rotation of drum 370, into an output voltage having a magnitude proportional to the speed of such movement or rotation of drum 370. The input of generator 426 is mechanically coupled to drum 370 by means represented by the broken line 428, and the electrical output of generator 426, a d.c. voltage, is connected by a line 430 to the input of a bounding circuit 432 connected between terminal 412 and the input of the integrating amplifier 418. In particular, the bounding circuit comprises an input resistor 434 having one terminal connected to line 430 and to the cathode of a diode 436, the anode of which is connected to line 416. The other terminal of resistor 434 is connected by a line 438 to one input terminal of an inverting amplifier 440. The other input terminal of amplifier 440 is connected to a circuit ground or reference terminal 442. The output terminal of amplifier 440 is connected through a resistor 444 to the line 438 leading to the one input terminal of amplifier 440. The output terminal of amplifier 440 also is connected to the anode of a diode 446, the cathode of which is connected to line 416.

The voltage on line 430 will limit the voltage at terminal 412 to a voltage not greater than 0.5 volt above the voltage on line 430 due to the 0.5 volt breakdown voltage of diode 436. The output voltage of amplifier 440 is substantially the voltage on line 430 but inverted, and this voltage limits the voltage at terminal 412 to a voltage not greater than 0.5 volts below the output voltage of amplifier 440 due to the 0.5 volt breakdown voltage of diode 446. The operation of the bounding circuit is illustrated further in the following table:

TABLE II

| Drum velocity | Voltage on line 430 | Limit on voltage at terminal 412 | Integrator speed |
|---|---|---|---|
| 15 inches/sec. | 10 volts | ± 10.5 volts | 10.5 volts/sec. |
| 7.5 inches/sec. | 5 volts | ± 5.5 volts | 5.5 volts/sec. |

It is therefore apparent that the present invention accomplishes its intended objects. While several embodiments of the present invention have been described in detail, this is for the purpose of illustration, not limitation.

I claim:

1. A d.c. electrostatic voltage follower comprising:
   (a) a detector adapted to be exposed to an electric field or potential associated with a surface;
   (b) means operatively associated with said detector for ionizing the air in the region between said detector and the surface only to a degree necessary to detect the presence of any non-zero field or potential between said detector and said surface and providing a resistive coupling of said detector to said region for establishing an ionic current flow into said detector in response to said non-zero field or potential difference between said detector and said surface;
   (c) a d.c. amplifier having an input and an output;
   (d) means for d.c. coupling said detector to said amplifier input; and
   (e) said amplifier having a d.c. coupled feedback path between said output and said detector to provide a d.c. reference potential for said detector so as to be connected as a d.c. voltage follower whereby the flow of ionic current into said detector drives said amplifier to cause said output to change said detector reference potential in a manner reducing the field or potential difference between said detector and the surface to zero so that said amplifier output and said detector are driven to the same potential as that on the surface independent of the distance between the surface and said detector.

2. Apparatus according to claim 1, wherein said means for establishing an ionic current flow comprises means for ionizing the air in the region between said detector and the surface to a degree sufficient to provide a low resistance path into said detector for said ionic current flow.

3. Apparatus according to claim 1, wherein said means for establishing an ionic current flow comprises an element of radioactive material having sufficient activity to ionize the air in the region between said detector and the surface to a degree sufficient to provide a low resistance path into said detector for said ionic current flow.

4. Apparatus according to claim 1, wherein said amplifier is connected for unity gain.

5. Apparatus according to claim 1, wherein said amplifier has a relatively high input impedance.

6. Apparatus according to claim 1, wherein said amplifier has an output circuit and further including means in said output circuit for increasing the voltage capability of said amplifier.

7. Apparatus according to claim 6, wherein said means increasing the voltage capability of said amplifier comprises a pair of high voltage transistors.

8. Apparatus according to claim 1, wherein said amplifier has an output circuit and further including means in said output circuit for limiting the flow of current in a load connected to said output circuit.

9. Apparatus according to claim 1, wherein said amplifier has an output circuit and further including a compensation network in said output circuit for providing stability against high frequency oscillations.

10. Apparatus according to claim 1, further including a preamplifier connected between said detector and said amplifier.

11. A probe for a d.c. electrostatic voltage follower comprising:
   (a) a support;
   (b) a detector carrier by said support and adapted to be exposed to an electric field or potential associated with a surface;
   (c) means carried by said support for ionizing the air in the region between said detector and the surface only to a degree necessary to detect the presence of any non-zero field or potential between said detector and said surface and providing a resistive coupling of said detector to said region for establishing an ionic current flow into said detector in response to said non-zero field or potential difference between said detector and said surface; and
   (d) a d.c. amplifier carried by said support and having an input and an output, said input being d.c. coupled to said detector, said amplifier having a d.c. coupled feedback path between said output and said detector to provide a d.c. reference potential for said detector so as to be connected as a d.c. voltage follower whereby the flow of ionic current into said detector drives said amplifier to cause said output to change said detector reference potential in a manner reducing the field or potential difference between said detector and the surface to zero so that said amplifier output and said detector are driven to the same potential as that on the surface independent of the distance between the surface and said detector.

12. Apparatus according to claim 11, wherein said means for establishing an ionic current flow comprises means for ionizing the air in the region between said detector and the surface to a degree sufficient to provide a low resistance path into said detector for said ionic current flow.

13. Apparatus according to claim 11, wherein said means for establishing an ionic current flow comprises an element of radioactive material having sufficient activity to ionize the air in the region between said detector and the surface to a degree sufficient to provide a low resistance path into said detector for said ionic current flow.

14. Apparatus according to claim 11, wherein said amplifier is connected for unity gain.

15. Apparatus according to claim 11, wherein said amplifier has a relatively high input impedance.

16. Apparatus according to claim 11, wherein said support comprises a housing having an opening in a surface thereof adapted to be disposed toward the surface, and wherein said means for establishing an ionic current flow comprises an element of radioactive material support within said housing in registry with said opening and having sufficient activity to ionize the air in the region between said detector and the surface to a degree sufficient to provide a low resistance path into said detector for said ionic current flow.

17. A probe for an electrostatic voltmeter comprising:
   (a) a support comprising a housing having a surface of electrically conducting material;
   (b) a detector carried by said support and adapted to be exposed to an electric field or potential associated with a surface, said detector being carried exteriorly of said housing adjacent said housing conductive surface;
   (c) means carried by said support for establishing an ionic current flow into said detector in response to the electric field or potential associated with the surface, said means for establishing an ionic current flow comprising an element of radioactive material carried exteriorly of said housing adjacent said housing conductive surface and having sufficient activity to ionize the air in the region between said detector and said housing conductive surface to a degree sufficient to provide a low resistance path into said detector for said ionic current flow;
   (d) an element of insulating material between said element of radioactive material and the surface with which the electric field or potential is associated to prevent coupling of atomic particles to the surface; and
   (e) an amplifier carried by said support and having an input and an output, said input being coupled to said detector, said amplifier having a feedback path whereby the flow of current into said detector and the surface drives said amplifier in a manner reducing the difference in potential between said detector and the surface to zero so that said amplifier output is driven to the same potential as that on the surface.

* * * * *